US009728923B2

(12) United States Patent
Wang

(10) Patent No.: US 9,728,923 B2
(45) Date of Patent: Aug. 8, 2017

(54) POWER SUPPLY OF TRANSFORMER AND LIGHT STRING THEREWITH

(71) Applicant: Guang Zhou Ting Shen Electric Co., Ltd., Guang Zhou, Guangdong (CN)

(72) Inventor: Chia-Chun Wang, Taichung (TW)

(73) Assignee: GUANG ZHOU TING SHEN ELECTRIC CO., LTD., Guang Zhou, Guangdong (CN)

( * ) Notice: Subject to any disclaimer, the term of this patent is extended or adjusted under 35 U.S.C. 154(b) by 61 days.

(21) Appl. No.: 14/858,315

(22) Filed: Sep. 18, 2015

(65) Prior Publication Data

US 2016/0380550 A1 Dec. 29, 2016

(30) Foreign Application Priority Data

Jun. 29, 2015 (CN) .................... 2015 2 0452087 U

(51) Int. Cl.

| | |
|---|---|
| ***H05K 5/00*** | (2006.01) |
| ***H01R 31/06*** | (2006.01) |
| *F21V 23/02* | (2006.01) |
| *F21S 4/10* | (2016.01) |
| *F21Y 115/10* | (2016.01) |
| *H01R 13/66* | (2006.01) |

(52) U.S. Cl.

CPC ................ *H01R 31/06* (2013.01); *F21S 4/10* (2016.01); *F21V 23/02* (2013.01); *F21Y 2115/10* (2016.08); *H01R 13/6675* (2013.01)

(58) Field of Classification Search

CPC ......... H02M 7/003; H02M 5/10; H02M 7/043

USPC ................................ 361/728–730, 752, 796

See application file for complete search history.

(56) References Cited

U.S. PATENT DOCUMENTS

| | | | | | |
|---|---|---|---|---|---|
| 5,210,698 | A * | 5/1993 | Topmiller | B29C 45/76 | 700/202 |
| 6,275,385 | B1 * | 8/2001 | Sahara | H05K 7/1414 | 361/679.54 |
| 6,411,514 | B1 * | 6/2002 | Hussaini | H05K 7/209 | 165/104.33 |
| 6,424,096 | B1 * | 7/2002 | Lowe | H05B 37/0272 | 315/185 R |
| 7,272,008 | B2 * | 9/2007 | Hussaini | H02J 7/0042 | 361/601 |
| 7,306,484 | B1 * | 12/2007 | Mahoney | H01R 24/542 | 439/578 |
| 8,246,372 | B1 * | 8/2012 | Walters | H01R 13/622 | 439/310 |
| 2003/0164645 | A1 * | 9/2003 | Crandell, III | B23K 9/1006 | 307/80 |

(Continued)

*Primary Examiner* — Hung S Bui

(57) ABSTRACT

A power supply of a transformer outputs alternating current (AC) and direct current (DC) and contains: a housing and a lid for covering a first end of the housing. An input interface is formed on a second end of the housing, and the lid includes a DC output interface and an AC output interface. A light string contains a power supply of a transformer and a light emitting unit, the power supply outputs alternating currents (AC) and direct currents (DC), and the power supply contains: a housing and a lid for covering a first end of the housing. An input interface is formed on a second end of the housing, the lid includes a DC output interface and an AC output interface, and the DC output interface couples with a DC output connector, and the DC output connector connects with plural bulbs of the light string.

8 Claims, 9 Drawing Sheets

(56) References Cited

U.S. PATENT DOCUMENTS

2003/0227522 A1* 12/2003 Pan ...................... B41J 2/17523
347/85

* cited by examiner

POWER SUPPLY OF TRANSFORMER AND LIGHT STRING THEREWITH

FIELD OF THE INVENTION

The present invention relates to a power supply of a transformer and a light string therewith.

BACKGROUND OF THE INVENTION

A conventional power supply of a transformer inputs, converts, and outputs a voltages via a transforming circuit to start a light string. The light string requires direct currents and outputs alternating currents, so the power supply is fixed between the light string and a main supply.

CN 203911035 discloses a power supply of a transformer contains a plug and a lid, wherein the plug has an input interface, and the lid has a DC output interface. The input interface is connected with the alternating currents, and the alternating currents are transformed into direct currents by a voltage transforming unit in the plug, thereafter the direct currents are supplied to the light string via the DC output interface.

However, the power supply cannot connect with plural bulbs of the light string simultaneously.

The present invention has arisen to mitigate and/or obviate the afore-described disadvantages.

SUMMARY OF THE INVENTION

The primary objective of the present invention is to provide a power supply of a transformer in which the housing is tightly connected with the lid in an ultrasonic welding manner to obtain waterproof effect and to reduce production cost.

Another objective of the present invention is to provide a light string which contains a power supply of a transformer and a light emitting unit, and in the power supply, the DC output interface is in connection with the plurality of bulb of the light emitting unit, and the AC output interface couples with the power supply of the transformer to series connect the plurality of bulbs together.

To achieve above-mentioned objectives, a power supply of a transformer provided by the present invention outputs alternating current (AC) and direct current (DC) and contains: housing and a lid for covering a first end of the housing.

An input interface is formed on a second end of the housing.

The lid includes a DC output interface and an AC output interface.

Preferably, the housing is tightly connected with the lid in an ultrasonic welding manner.

Preferably, the housing includes an accommodating cavity defined therein and accommodating a voltage transforming unit; the input interface has two conducting legs inserted into the accommodating cavity and electrically connected with the voltage transforming unit.

Preferably, the housing further includes two slots, and each slot is defined on each of two opposite sides of the accommodating cavity; the voltage transforming unit includes a printed circuit board (PCB) and a voltage transformation circuit arranged on the PCB, wherein two opposite sides of the PCB are retained in the two slots easily.

Preferably, the PCB has two clampers corresponding to the two conducting legs, wherein each clamper has a first retaining piece and a second retaining piece opposite to the first retaining piece, and the two conducting legs are defined between the first retaining piece and the second retaining piece.

Preferably, the input interface has threads formed on an outer wall thereof, the DC output interface has threads arranged on an outer wall thereof, and the AC output interface has threads formed on an outer wall thereof.

To achieve above-mentioned objectives, a light string provided by the present invention contains a power supply of a transformer and a light emitting unit, the power supply outputting alternating currents (AC) and direct currents (DC), and the power supply contains: a housing and a lid for covering a first end of the housing.

An input interface is formed on a second end of the housing.

The lid includes a DC output interface and an AC output interface.

The DC output interface couples with a DC output connector, and the DC output connector connects with plural bulbs of the light string.

Preferably, the housing includes an accommodating cavity defined therein and accommodating a voltage transforming unit; the DC output connector is electrically connected with the voltage transforming unit.

Preferably, the input interface has two conducting legs inserted into the accommodating cavity and electrically connected with the voltage transforming unit; the AC output interface has an AC output connector electrically connected with the two conducting legs.

Preferably, the input interface has threads arranged on an outer wall thereof, the DC output interface has threads arranged on an outer wall thereof, the DC output interface couples with a DC output connector by using its threads; the AC output interface joins with an AC output connector by means of its threads.

DETAILED DESCRIPTION OF THE PREFERRED EMBODIMENTS

With reference to FIGS. 1-6, a power supply of a transformer according to a first embodiment of the present invention outputs alternating current (AC) and direct current (DC) and comprises: a housing 1, a lid 2 for covering a first end of the housing 1, and a transforming unit 3.

Figure 1:
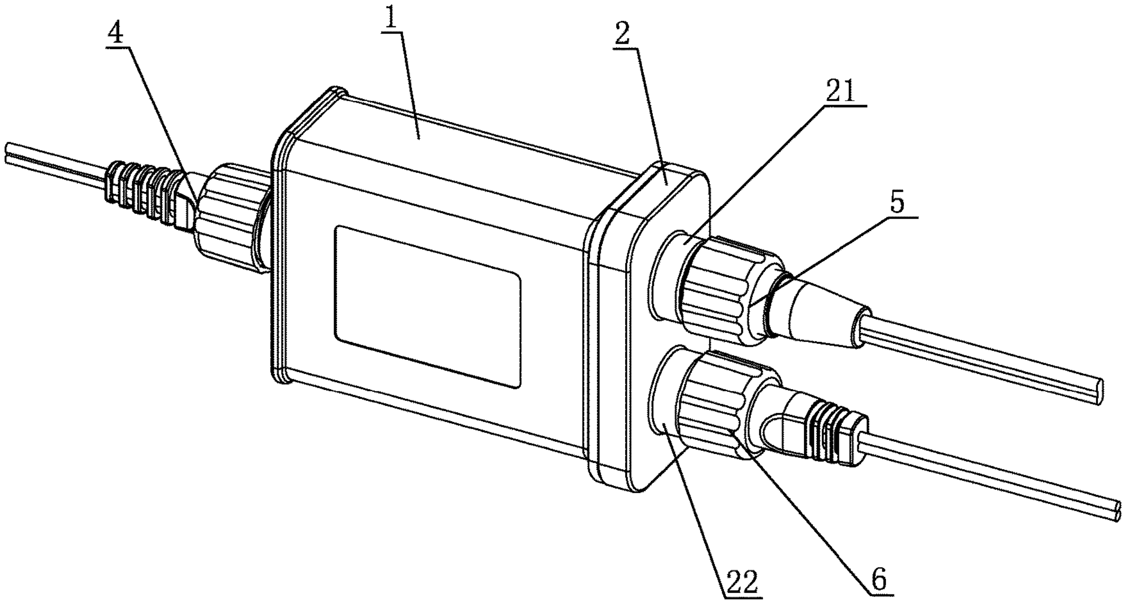
FIG. 1 is a perspective view showing the assembly of a power supply of a transformer according to a first embodiment of the present invention.
Figure 2:
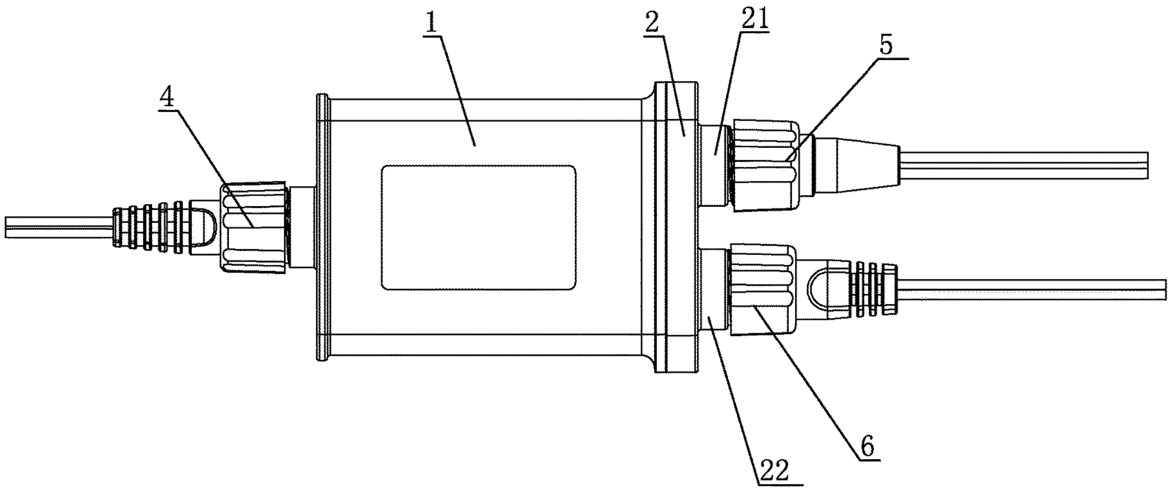
FIG. 2 is a side plane view showing the assembly of the power supply of the transformer according to the first embodiment of the present invention.
Figure 3:
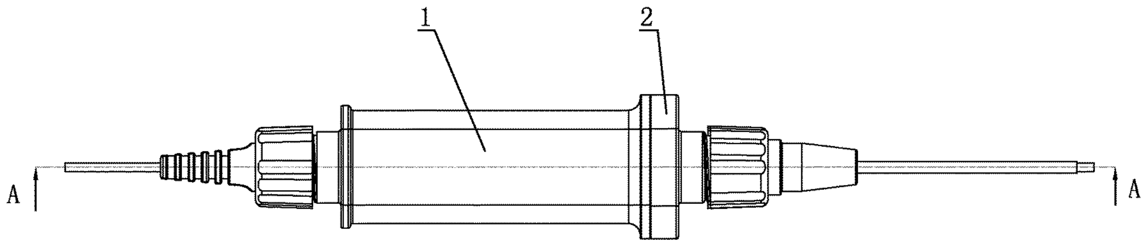
FIG. 3 is another side plane view showing the assembly of the power supply of the transformer according to the first embodiment of the present invention.
Figure 4:
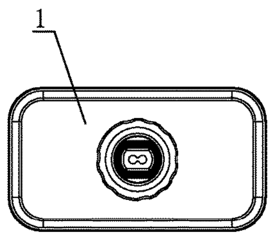
FIG. 4 is also another side plane view showing the assembly of the power supply of the transformer according to the first embodiment of the present invention.
Figure 5:
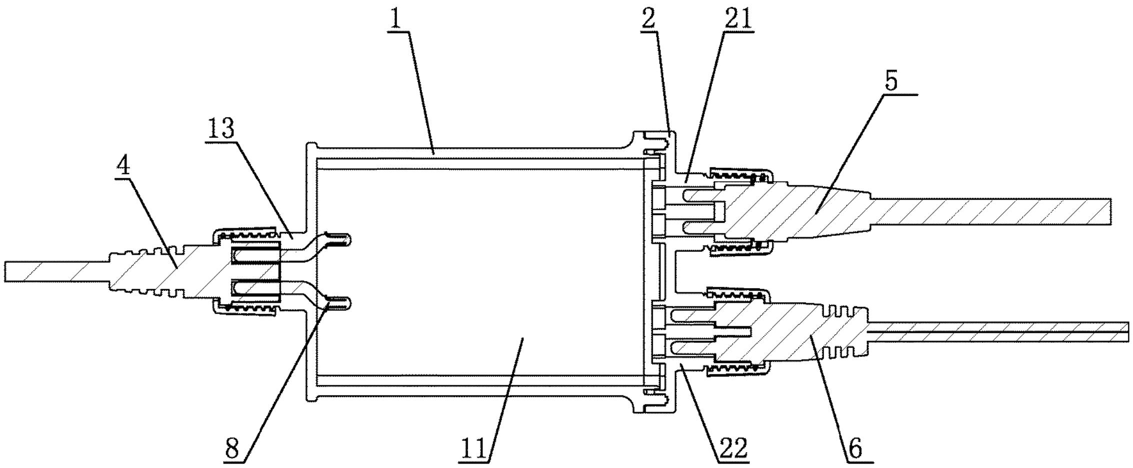
FIG. 5 is a cross sectional view taken along the line A-A of FIG. 3.
Figure 6:
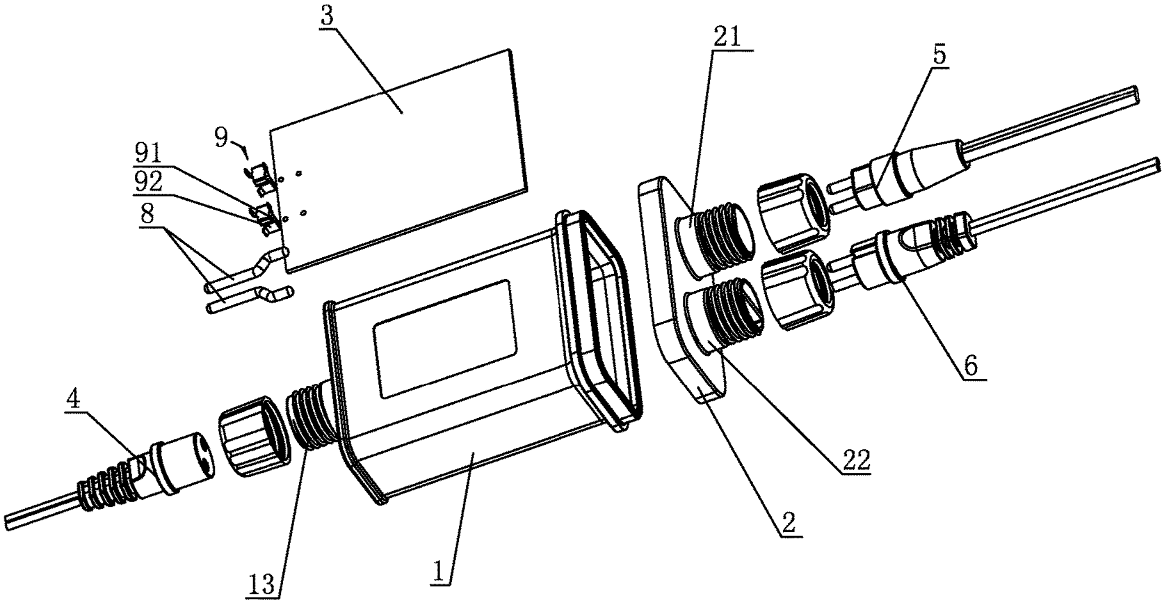
FIG. 6 is a perspective view showing the exploded components of the power supply of the transformer according to the first embodiment of the present invention.
Figure 7:
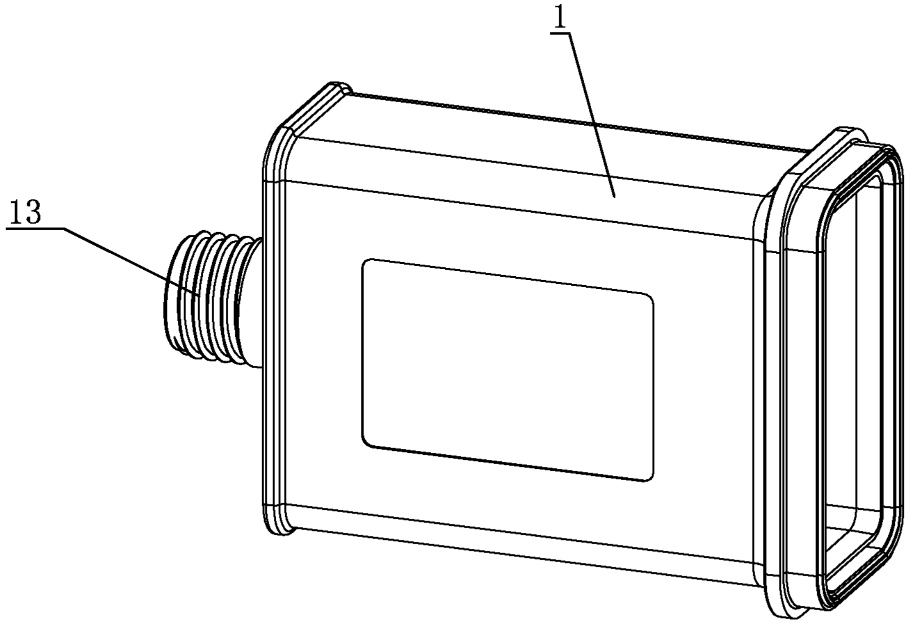
FIG. 7 is a perspective view of a part of the power supply of the transformer according to the first embodiment of the present invention.
Figure 8:
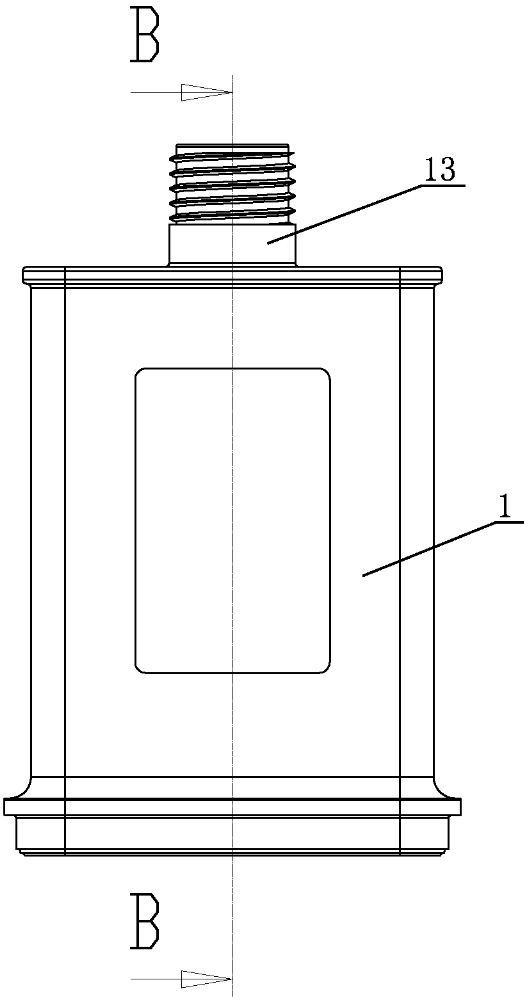
FIG. 8 is a side plane view of a part of the power supply of the transformer according to the first embodiment of the present invention.
Figure 9:
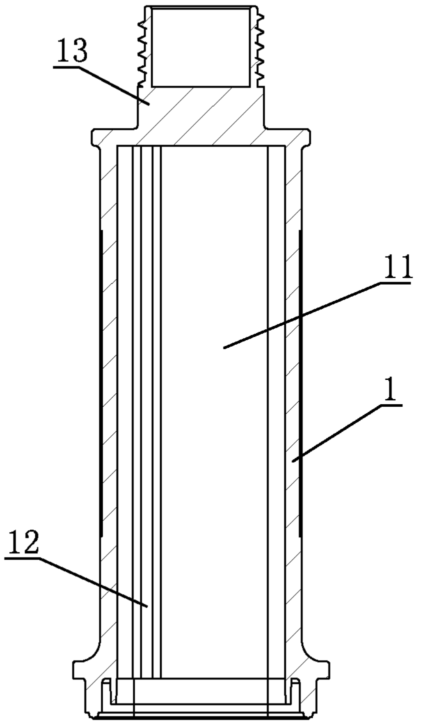
FIG. 9 is a cross sectional view taken along the line B-B of FIG. 8.
Figure 10:
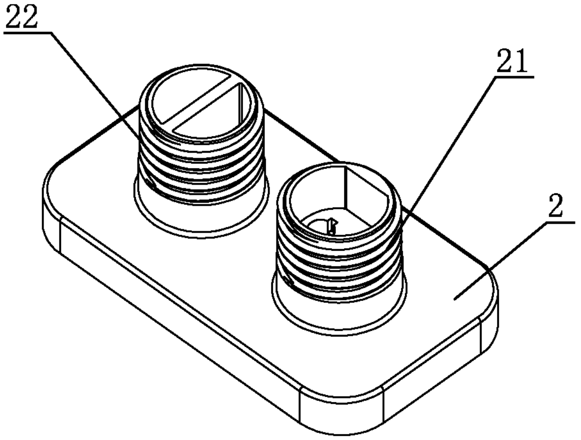
FIG. 10 is another perspective view of a part of the power supply of the transformer according to the first embodiment of the present invention.

Referring to FIGS. 5 and 9, the housing 1 includes an accommodating cavity 11 defined therein and includes two slots 12, and each slot 12 is defined on each of two opposite sides of the accommodating cavity 11. As shown in FIGS. 1 to 9, the housing 1 also includes an opening defined on the first end thereof and includes an input interface 13 formed on a second end thereof, wherein the input interface 13 has threads arranged on an outer wall thereof. As illustrated in FIGS. 5 and 6, the input interface 13 has two conducting legs 8 inserted into the accommodating cavity 11.

With reference to FIGS. 1 to 6, the housing 1 is tightly connected with the lid 2 in an ultrasonic welding manner to obtain waterproof effect and to reduce production cost.

With reference to FIGS. 1 to 6 and 10, the lid 2 includes a DC output interface 21 and an AC output interface 22. The DC output interface 21 has threads arranged on an outer wall thereof, and the AC output interface 22 has threads formed on an outer wall thereof. The DC output interface 21 also has a DC conduction sleeve fitted therein, and the AC output interface 22 has an AC conduction sleeve fitted therein.

The voltage transforming unit 3 includes a printed circuit board (PCB) and a voltage transformation circuit arranged on the PCB, wherein two opposite sides of the PCB are retained in the two slots 12 easily.

Referring to FIG. 6, the PCB has two clampers 9 corresponding to the two conducting legs 8, wherein each clamper 9 has a first retaining piece 91 and a second retaining piece 92 opposite to the first retaining piece 91. The two conducting legs 8 are defined between the first retaining piece 91 and the second retaining piece 92, such that the voltage transforming unit 3 is fixed and removed easily.

The DC conduction sleeve is electrically connected with the two conducting legs 8 through the voltage transforming unit 3, such that when the input interface 13 inputs alternating currents, the alternating currents are transformed into direct currents by the voltage transforming unit 3, and the direct currents are outputted by the DC output interface 21.

The AC conduction sleeve is electrically connected with the two conducting legs 8, and the AC output interface outputs the alternating currents.

As shown in FIGS. 1 to 6, the input interface connects with an input connector 4 by ways of its threads. The DC output interface couples with a DC output connector 5 by using its threads. The AC output interface joins with an AC output connector 6 by means of its threads. Thereby, said connectors are in connection with said interfaces fixedly.

In this embodiment, the power supply of the transformer further comprises the input interface 13, the DC output interface 21, and the AC output interface 22, such that when one of said output interfaces drops off, the other of said output interfaces are applicable for expanding electrical connection. For example, when the DC output interface 21 connects with plural bulbs of a light string, the AC output interface is coupled with the power supply of the transformer.

Figure 11:
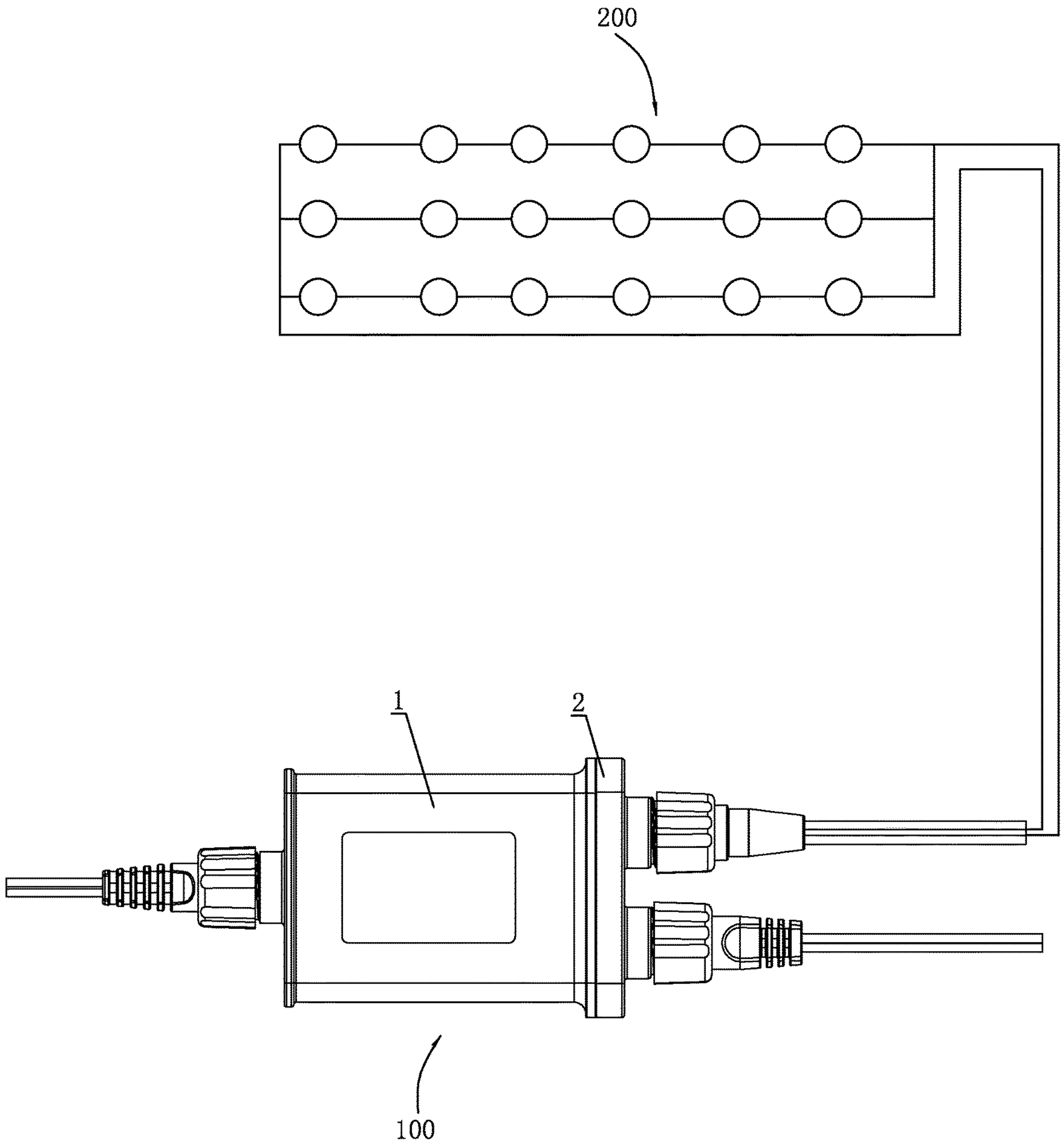
FIG. 11 is side plane view showing the application of a light string with a power supply of a transformer according to a second embodiment of the present invention.

With reference to FIG. 11, a light string according to a second embodiment of the present invention comprises a power supply 100 of a transformer and a light emitting unit 200.

Referring to FIGS. 1 to 6, the power supply of the transformer comprises a housing 1, a lid 2, and a voltage transforming unit 3.

The light emitting unit 200 includes a plurality of LED bulbs which are parallelly or series connected together.

As shown in FIGS. 5 and 9, the housing 1 includes an accommodating cavity 11 defined therein and includes two slots 12, and each slot 12 is defined on each of two opposite sides of the accommodating cavity 11. As shown in FIGS. 1 to 9, the housing 1 also includes an opening defined on a first end thereof and includes an input interface 13 formed on a second end thereof, wherein the input interface 13 has threads arranged on an outer wall thereof. As illustrated in FIGS. 5 and 6, the input interface 13 has two conducting legs 8 inserted into the accommodating cavity 11.

With reference to FIGS. 1 to 6, the housing 1 is tightly connected with the lid 2 in an ultrasonic welding manner to obtain waterproof effect and to reduce production cost.

With reference to FIGS. 1 to 6 and 10, the lid 2 includes a DC output interface 21 and an AC output interface 22. The DC output interface 21 has threads arranged on an outer wall thereof, and the AC output interface 22 has threads formed on an outer wall thereof. The DC output interface 21 also has a DC conduction sleeve fitted therein, and the AC output interface 22 has an AC conduction sleeve fitted therein.

The voltage transforming unit 3 includes a printed circuit board (PCB) and a voltage transformation circuit arranged on the PCB, wherein two opposite sides of the PCB are retained in the two slots 12 easily.

Referring to FIG. 6, the PCB has two clampers 9 corresponding to the two conducting legs 8, wherein each clamper 9 has a first retaining piece 91 and a second retaining piece 92 opposite to the first retaining piece 91. The two conducting legs 8 are defined between the first retaining piece 91 and the second retaining piece 92, such that the voltage transforming unit 3 is fixed and removed easily.

The DC conduction sleeve is electrically connected with the two conducting legs 8 through the voltage transforming unit 3, such that when the input interface 13 inputs alternating currents, the alternating currents are transformed into direct currents by the voltage transforming unit 3, and the direct currents are outputted by the DC output interface 21.

The AC conduction sleeve is electrically connected with the two conducting legs 8, and the AC output interface outputs the alternating currents.

As shown in FIGS. 1 to 6, the input interface connects with an input connector 4 by ways of its threads. The DC output interface couples with a DC output connector 5 by using its threads. The AC output interface joins with an AC output connector 6 by means of its threads. Thereby, said connectors are in connection with said interfaces fixedly.

Accordingly, the DC output interface 221 is in connection with the plurality of bulb of the light emitting unit, and the AC output interface couples with the power supply of the transformer to series connect the plurality of bulbs together.

While the preferred embodiments of the invention have been set forth for the purpose of disclosure, modifications of the disclosed embodiments of the invention as well as other embodiments thereof may occur to those skilled in the art.

Accordingly, the appended claims are intended to cover all embodiments which do not depart from the spirit and scope of the invention.

What is claimed is:

1. A power supply of a transformer outputting alternating current (AC) and direct current (DC) and comprising: a housing and a lid for covering a first end of the housing;
- wherein an input interface is formed on a second end of the housing;
- wherein the lid includes a DC output interface and an AC output interface;
- wherein the housing includes an accommodating cavity defined therein and accommodating a voltage transforming unit; the input interface has two conducting legs inserted into the accommodating cavity and electrically connected with the voltage transforming unit;
- wherein the housing further includes two slots, and each slot is defined on each of two opposite sides of the accommodating cavity; the voltage transforming unit includes a printed circuit board (PCB) and a voltage transformation circuit arranged on the PCB, wherein two opposite sides of the PCB are retained in the two slots easily;
- wherein the PCB has two clampers corresponding to the two conducting legs, wherein each clamper has a first retaining piece and a second retaining piece opposite to the first retaining piece, and the two conducting legs are defined between the first retaining piece and the second retaining piece.

2. The power supply of the transformer as claimed in claim 1, wherein the housing is tightly connected with the lid in an ultrasonic welding manner.

3. The power supply of the transformer as claimed in claim 1, wherein the input interface has threads formed on an outer wall thereof, the DC output interface has threads arranged on an outer wall thereof, and the AC output interface has threads formed on an outer wall thereof.

4. A light string comprising a power supply of a transformer and a light emitting unit, the power supply outputting alternating currents (AC) and direct currents (DC), and the power supply comprising: a housing and a lid for covering a first end of the housing;
- wherein an input interface is formed on a second end of the housing;
- wherein the lid includes a DC output interface and an AC output interface;
- the DC output interface couples with a DC output connector, and the DC output connector connects with plural bulbs of the light string.

5. The power supply of the transformer as claimed in claim 4, wherein the housing includes an accommodating cavity defined therein and accommodating a voltage transforming unit; the DC output connector is electrically connected with the voltage transforming unit.

6. The power supply of the transformer as claimed in claim 5, wherein the input interface has two conducting legs inserted into the accommodating cavity and electrically connected with the voltage transforming unit; the AC output interface has an AC output connector electrically connected with the two conducting legs.

7. The power supply of the transformer as claimed in claim 4, wherein the input interface has two conducting legs inserted into the accommodating cavity and electrically connected with the voltage transforming unit; the AC output interface has an AC output connector electrically connected with the two conducting legs.

8. The power supply of the transformer as claimed in claim 4, wherein the input interface has threads arranged on an outer wall thereof, the DC output interface has threads arranged on an outer wall thereof, the DC output interface couples with a DC output connector by using its threads; the AC output interface joins with an AC output connector by means of its threads.

* * * * *